United States Patent
Nagamura et al.

(10) Patent No.: US 7,936,562 B2
(45) Date of Patent: May 3, 2011

(54) GRIP DEVICE AND INFORMATION PROCESSING UNIT

(75) Inventors: Yoshiaki Nagamura, Osaka (JP); Hitoshi Nakatani, Osaka (JP); Shintaro Tanaka, Osaka (JP); Haruka Kaneko, Kyoto (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 12/551,829

(22) Filed: Sep. 1, 2009

(65) Prior Publication Data

US 2010/0053888 A1    Mar. 4, 2010

(30) Foreign Application Priority Data

Sep. 2, 2008   (JP) ................................. 2008-225049

(51) Int. Cl.
*G06F 1/16*    (2006.01)
(52) U.S. Cl. ..................... 361/679.59; 16/429
(58) Field of Classification Search ............ 361/679.59; 16/113.1, 429
See application file for complete search history.

(56) References Cited

U.S. PATENT DOCUMENTS

| | | | | |
|---|---|---|---|---|
| 655,039 A | * | 7/1900 | Wilhite et al. ................... | 190/39 |
| 670,492 A | * | 3/1901 | Gould .............................. | 190/39 |
| 4,895,231 A | * | 1/1990 | Yamaguchi et al. ........... | 190/115 |
| 5,075,926 A | * | 12/1991 | Jeong ............................... | 16/429 |
| 6,017,106 A | * | 1/2000 | Adams et al. ................ | 312/223.2 |
| 6,231,144 B1 | * | 5/2001 | Chen et al. .................... | 312/332.1 |
| 6,374,460 B1 | * | 4/2002 | Edevold et al. ................ | 16/422 |
| 2010/0020490 A1 | * | 1/2010 | Lin .......................... | 361/679.55 |
| 2010/0045431 A1 | * | 2/2010 | Nagamura et al. ........... | 340/5.82 |
| 2010/0046154 A1 | * | 2/2010 | Nagamura et al. ........ | 361/679.21 |
| 2010/0046155 A1 | * | 2/2010 | Kaneko et al. ............ | 361/679.27 |
| 2010/0046159 A1 | * | 2/2010 | Nakatani et al. .......... | 361/679.33 |
| 2010/0046166 A1 | * | 2/2010 | Tanaka et al. ............. | 361/679.59 |
| 2010/0301717 A1 | * | 12/2010 | Wang ......................... | 312/223.1 |

FOREIGN PATENT DOCUMENTS

| | | |
|---|---|---|
| JP | 6-309065 A | 11/1994 |
| JP | 6-314138 A | 11/1994 |

* cited by examiner

*Primary Examiner* — Lisa Lea-Edmonds
(74) *Attorney, Agent, or Firm* — Hamre, Schumann, Mueller & Larson, P.C.

(57) ABSTRACT

In a grip device of the present invention, shielding members are placed in the openings of a handle in which arm members are to be arranged, respectively. This can make it difficult for a foreign matter to enter the handle via the openings. The presence of the shielding members can prevent a foreign matter from being caught between the handle and each of the arm members when the handle is moved from the extended position to the retracted position, resulting in a smooth movement of the handle.

10 Claims, 11 Drawing Sheets

GRIP DEVICE AND INFORMATION PROCESSING UNIT

BACKGROUND OF THE INVENTION

1. Field of the Invention

The present invention relates to a grip device with a handle that can be held by a user, and an information processing unit including the grip device.

2. Description of Related Art

A conventional notebook computer with a built-in handle has been proposed for ease of carrying. JP 6(1994)-314138 A and JP 6(1994)-309065 A disclose a grip device including arm members for connecting a grip of a handle and the main body.

FIG. 7 is a perspective view of a conventional notebook computer with a handle. FIG. 8 is a plan view showing the main parts in the vicinity of the handle of the notebook computer shown in FIG. 7. The notebook computer shown in FIGS. 7 and 8 includes a first case 101 and a second case 102. The first case 101 is provided with a keyboard, an information processing means, etc. The second case 102 is provided with a liquid crystal display. The first case 101 and the second case 102 are supported rotatably. In FIGS. 7 and 8, the notebook computer is folded with the second case 102 being brought into contact with the first case 101. A handle 104 that can be held by a user is provided on the side of the first case 101. The handle 104 is supported by the first case 101 via arm members 141, 142 at both ends in the longitudinal direction.

As shown in FIG. 8, substantially oval recesses 104a, 104b are formed inside the handle 104 at both ends in the longitudinal direction. A protrusion 141a of the arm member 141 is fitted movably into the recess 104a. Similarly, a protrusion 142a of the arm member 142 is fitted movably into the recess 104b. A protrusion 101a of the first case 101 is engaged loosely with the other end of the arm member 141. Similarly, a protrusion 101b of the first case 101 is engaged loosely with the other end of the arm member 142. The arm member 141 is supported rotatably about an axis of the protrusion 101a. The arm member 142 is supported rotatably about an axis of the protrusion 101b.

For use of the handle 104 of the conventional notebook computer, a user pulls the handle 104 from its retracted position (not shown) in the direction of the arrow Y. When the handle 104 is extended, as shown in FIGS. 7 and 8, a space in which the hand can be placed is formed between the handle 104 and the first case 101. The user can hold the handle 104 by placing the hand in this space.

While the handle 104 is pulled from the retracted position in the direction of the arrow Y, the arm member 141 rotates about the axis of the protrusion 101a and the arm member 142 rotates about the axis of the protrusion 101b. Moreover, the protrusion 141a is moved in the recess 104a to the left in FIG. 8 and the protrusion 141b is moved in the recess 104b to the right in FIG. 8.

Next, when the handle 104 is retracted, it is moved from the extended position shown in FIG. 7 in the direction of the arrow X. At this time, the arm member 141 rotates about the axis of the protrusion 101a and the arm member 142 rotates about the axis of the protrusion 101b. In this manner, the handle 104 can be moved to the retracted position.

However, in the grip device shown in FIGS. 7 and 8, since the arm members 141, 142 can rotate relative to the handle 104, openings 104d, 104e have to be formed in the outer frame of the handle 104 near the positions where the arm members 141, 142 are attached, respectively. Therefore, when the handle 104 is retracted from the extended position shown in FIGS. 7 and 8 in the direction of the arrow X, a foreign matter may be caught in the opening 104d or 104e. Thus, the retracting operation of the handle 104 cannot be performed smoothly.

SUMMARY OF THE INVENTION

Therefore, with the foregoing in mind, it is an object of the present invention to provide a grip device that smoothly can perform pulling and retracting operations of the handle, and an information processing unit including the grip device.

A grip device of the present invention includes the following: a pair of first and second stationary portions that are fixed to a case; a pair of first and second arm members, each of which has two ends, and one end of the first arm member and one end of the second arm member are supported rotatably by the first stationary portion and the second stationary portion, respectively; and a grip that is supported rotatably between the other end of the first arm member and the other end of the second arm member, that has openings at both ends for receiving the first arm member and the second arm member, and that can accommodate the first arm member and the second arm member through the openings. The grip includes shielding portions for shielding the openings.

An information processing unit of the present invention includes the following: an information signal input portion for inputting an information signal; a case containing an information processing means for processing the information signal; and a grip device coupled to the case. The grip device includes the following: a pair of first and second stationary portions that are fixed to the case; a pair of first and second arm members, each of which has two ends, and one end of the first arm member and one end of the second arm member are supported rotatably by the first stationary portion and the second stationary portion, respectively; and a grip that is supported rotatably between the other end of the first arm member and the other end of the second arm member, that has openings at both ends for receiving the first arm member and the second arm member, and that can accommodate the first arm member and the second arm member through the openings. The grip includes shielding portions for shielding the openings.

According to the present invention, the pulling and retracting operations of the handle can be performed smoothly.

DETAILED DESCRIPTION OF THE INVENTION

Figure 1:
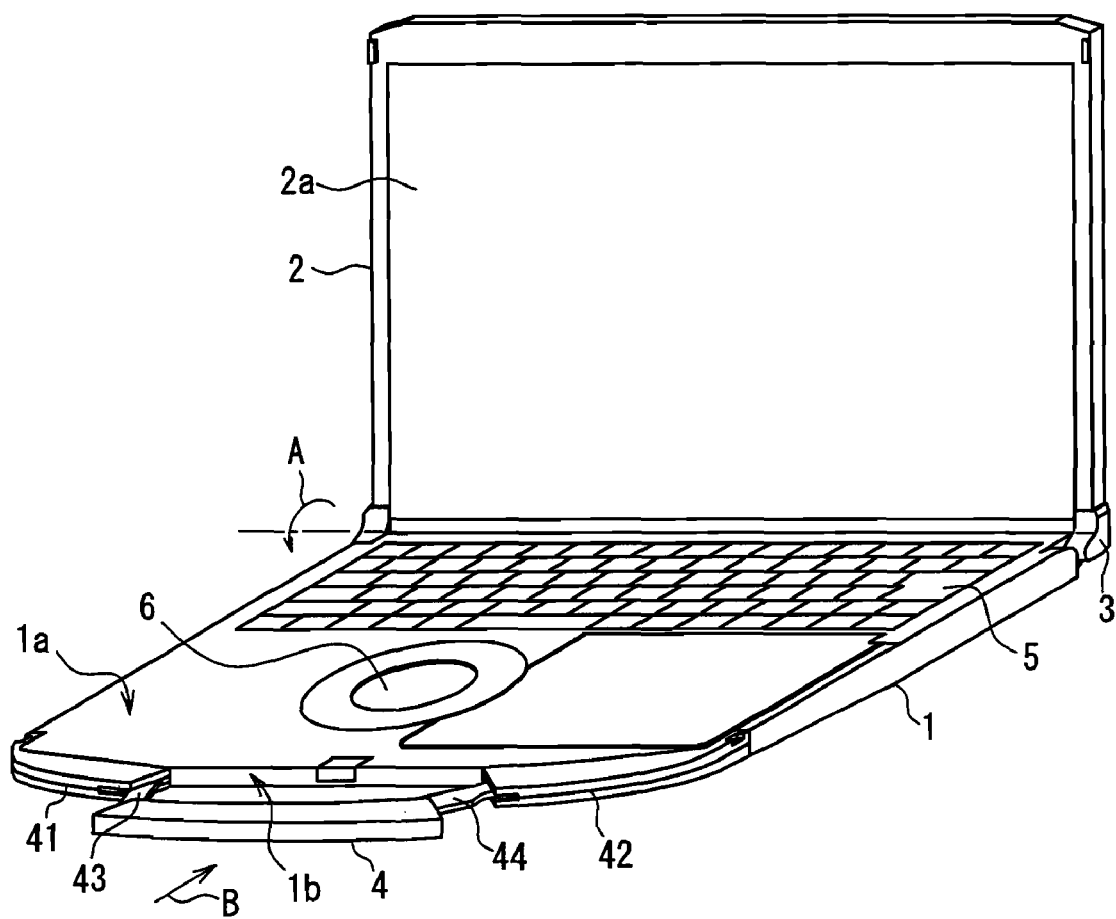
FIG. 1 is a perspective view showing the appearance of an information processing unit of an embodiment of the present invention (first state).

The grip device of the present invention includes the following: a pair of first and second stationary portions that are fixed to a case; a pair of first and second arm members, each of which has two ends, and one end of the first arm member and one end of the second arm member are supported rotatably by the first stationary portion and the second stationary portion, respectively; and a grip that is supported rotatably between the other end of the first arm member and the other end of the second arm member, that has openings at both ends for receiving the first arm member and the second arm member, and that can accommodate the first arm member and the second arm member through the openings. The grip includes shielding portions for shielding the openings.

The information processing unit of the present invention includes the following: an information signal input portion for inputting an information signal; a case containing an information processing means for processing the information signal; and a grip device coupled to the case. The grip device includes the following: a pair of first and second stationary portions that are fixed to the case; a pair of first and second arm members, each of which has two ends, and one end of the first arm member and one end of the second arm member are supported rotatably by the first stationary portion and the second stationary portion, respectively; and a grip that is supported rotatably between the other end of the first arm member and the other end of the second arm member, that has openings at both ends for receiving the first arm member and the second arm member, and that can accommodate the first arm member and the second arm member through the openings. The grip includes shielding portions for shielding the openings.

The grip device of the present invention can have the following aspects based on the above configuration.

In the grip device of the present invention, the grip may be supported by the first stationary portion and the second stationary portion so as to be movable between a retracted position that is close to the case and an extended position that is away from the case, and the first arm member and the second arm member may have first notches that are in contact with the shielding portions when the grip is at the retracted position, respectively. This configuration can provide tactile feedback when the grip is moved from the extended position to the retracted position, and also can position the grip at the retracted position.

In the grip device of the present invention, the first notches may be provided in the outer edges of the first arm member and the second arm member on the opposite side to the case, and the inner surface of each of the first notches on the stationary portion side is substantially flush with a side of the stationary portion when the grip is at the extended position. This configuration can prevent a foreign matter from being caught between the grip and each of the stationary portions when the grip is moved from the extended position to the retracted position, and thus can achieve a smooth movement of the grip.

In the grip device of the present invention, the first arm member and the second arm member further may have second notches that are in contact with the shielding portions when the grip is at the extended position, respectively. This configuration can provide tactile feedback when the grip is at the extended position, and also can position the grip at the extended position.

In the grip device of the present invention, the shielding portions may be made of a plastic resin. This configuration can provide tactile feedback both when the grip is moved from the retracted position to the extended position and when the grip is moved from the extended position to the retracted position. Moreover, even if the arm members come into contact with the shielding portions during the movement of the grip, this configuration can prevent the arm members from being scratched easily or the coating of the arm members from coming off easily. This configuration also can reduce unusual sounds produced when the arm members come into contact with the shielding portions.

Embodiment

1. Configuration of Information Processing Unit

Figure 2:
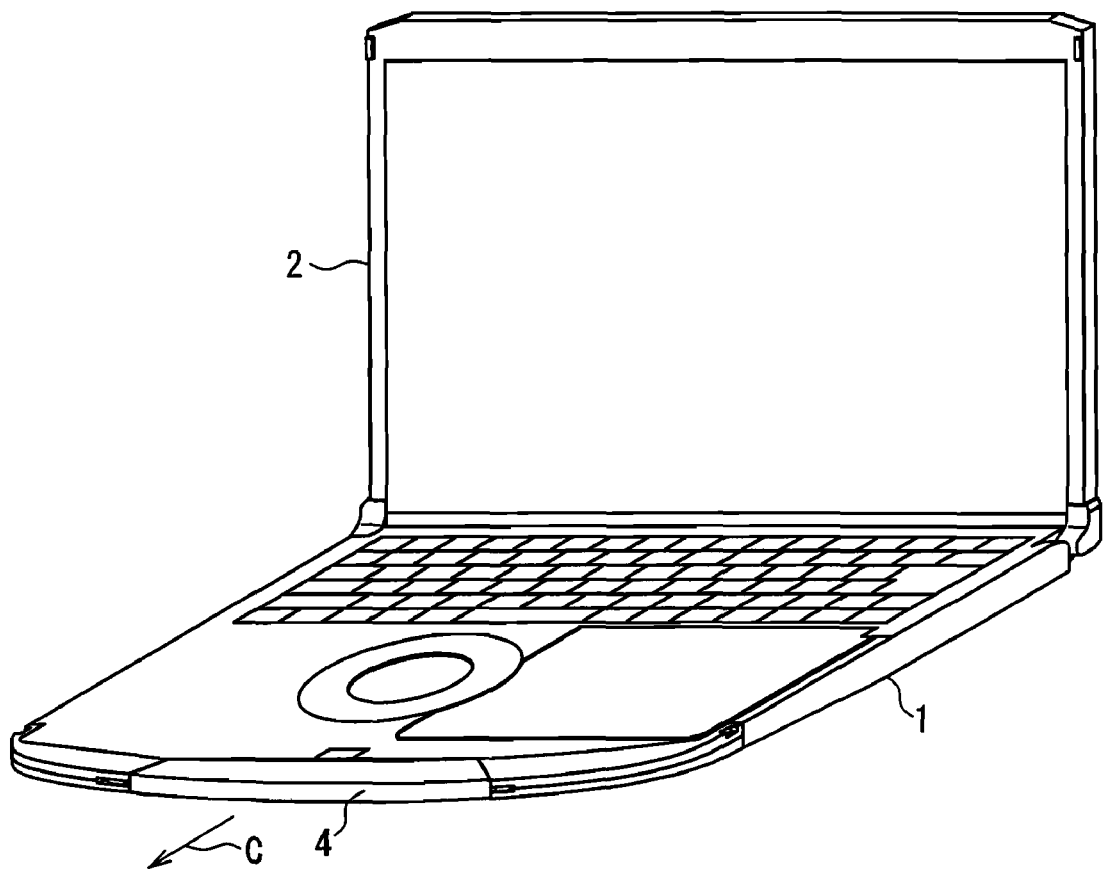
FIG. 2 is a perspective view showing the appearance of an information processing unit of an embodiment of the present invention (first state).
Figure 3:
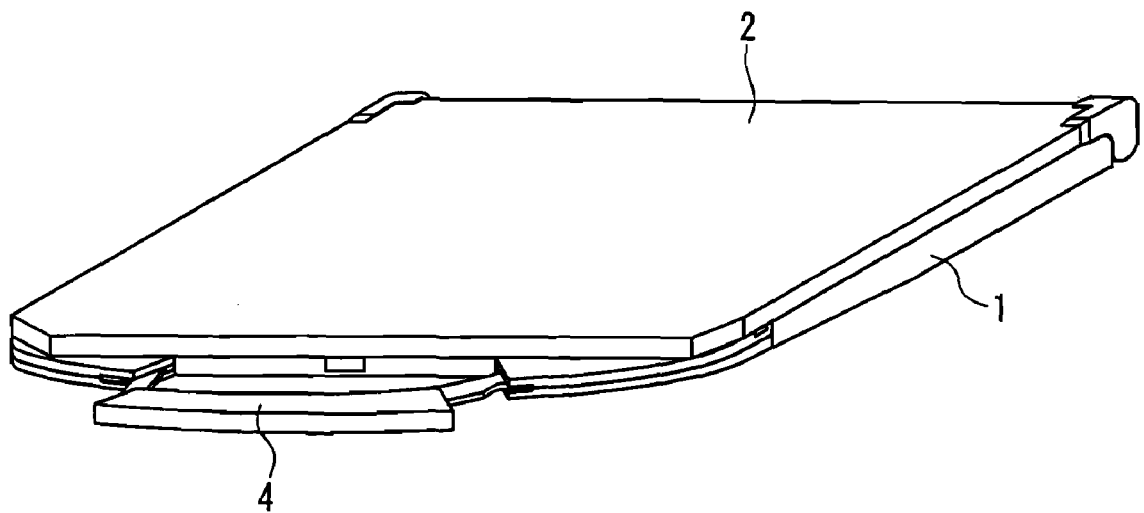
FIG. 3 is a perspective view showing the appearance of an information processing unit of an embodiment of the present invention (second state).

FIGS. 1 and 2 are perspective views showing the appearance of an information processing unit including a grip device of this embodiment. FIGS. 1 and 2 show a first state of a notebook computer as an example of the information processing unit. In FIG. 1, a handle is extended. Hereinafter, the state shown in FIG. 1 is referred to as an "extended state", and the position of the handle in this state is referred to as an "extended position". In FIG. 2, the handle is retracted. Hereinafter, the state shown in FIG. 2 is referred to as a "retracted state", and the position of the handle in this state is referred to as a "retracted position". FIG. 3 is a perspective view showing a second state of the notebook computer of this embodiment. In this embodiment, the notebook computer is used as an example of the information processing unit. However, the information processing unit may be any portable equipment such as a portable telephone or medical equipment as long as it has at least a handle that can be held by a user.

As shown in FIGS. 1 to 3, the notebook computer includes a first case 1 and a second case 2. The first case 1 contains a circuit board on which various electric elements are mounted, a hard disk drive, etc. The second case 2 is provided with a liquid crystal display 2a. The first and second cases 1, 2 are supported rotatably by hinges 3. The second case 2 can be changed from the position in FIG. 1 (i.e., the first state) to the position in FIG. 3 (i.e., the second state) when rotated in the direction of the arrow A.

When the surface of the first case 1 that faces the second case 2 in the second state of the notebook computer is defined as an "upper side", a keyboard 5 and a pointing device 6 are provided on an upper surface 1a of the first case 1. The keyboard 5 receives an input operation of various characters. The painting device 6 receives an operation of moving the cursor on the liquid crystal display 2a to a desired position.

Moreover, when the handle 4 side of the notebook computer in the second state is defined as a "front side", supporting members 41, 42 are fixed to a side 1b on the front of the first case 1 (referred to as a "front surface" of the first case 1 in the following). The supporting member 41 rotatably supports one end of an arm member 43. The supporting member 42 rotatably supports one end of an arm member 44. The handle 4 is supported between the other end of the arm member 43 and the other end of the arm member 44. A user can hold the handle 4 with his/her hand. That is, the user can carry the notebook computer with his/her hand by holding the handle 4 of the notebook computer in the second state, as shown in FIG. 3.

2. Configuration of Grip Device

Figure 4:
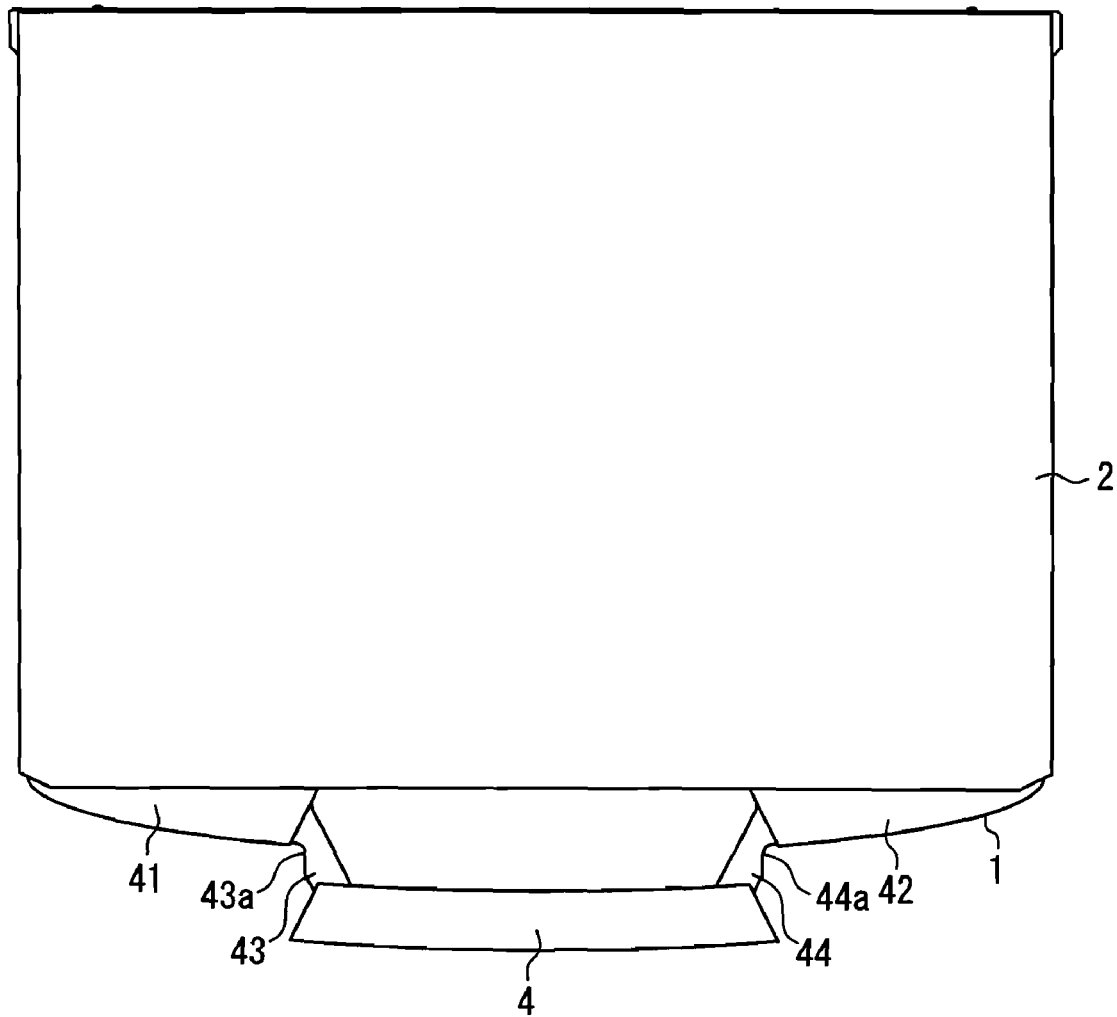
FIG. 4 is a plan view showing the appearance of an information processing unit of an embodiment of the present invention (second state).

FIG. 4 is a plan view of the notebook computer (in the second state) including the grip device. As shown in FIG. 4, the grip device of this embodiment includes the handle 4, the supporting member 41, the supporting member 42, the arm member 43, and the arm member 44.

Both ends of the handle 4 in the longitudinal direction are supported by one end of the arm member 43 and one end of the arm member 44. The handle 4 may be made of a metal such as magnesium or a resin. The handle 4 preferably is curved so that a user easily can hold the handle with his/her hand. The handle 4 preferably has concave portions to fit the fingers of one hand so that a user easily can hold the handle with his/her hand. The handle 4 preferably has a plurality of narrow grooves in the direction that is substantially the same as the longitudinal direction of the handle so as not to slip out of the user's hand easily. The handle 4 preferably is provided with rubber or the like so as not to sip out of the user's hand easily.

The other end of the arm member 43 is supported rotatably by the supporting member 41. The other end of the arm member 44 is supported rotatably by the supporting member 42.

The supporting members 41, 42 are fixed to the front surface with screws or other engagement systems. The supporting members 41, 42 may be made of a metal such as magnesium or a resin. In this embodiment, although the supporting members 41, 42 and the first case 1 are discrete members, the first case 1 may be formed to have portions that are the same as the supporting members 41, 42 in both shape and function. This configuration can reduce the number of components and the cost.

Figure 5A:
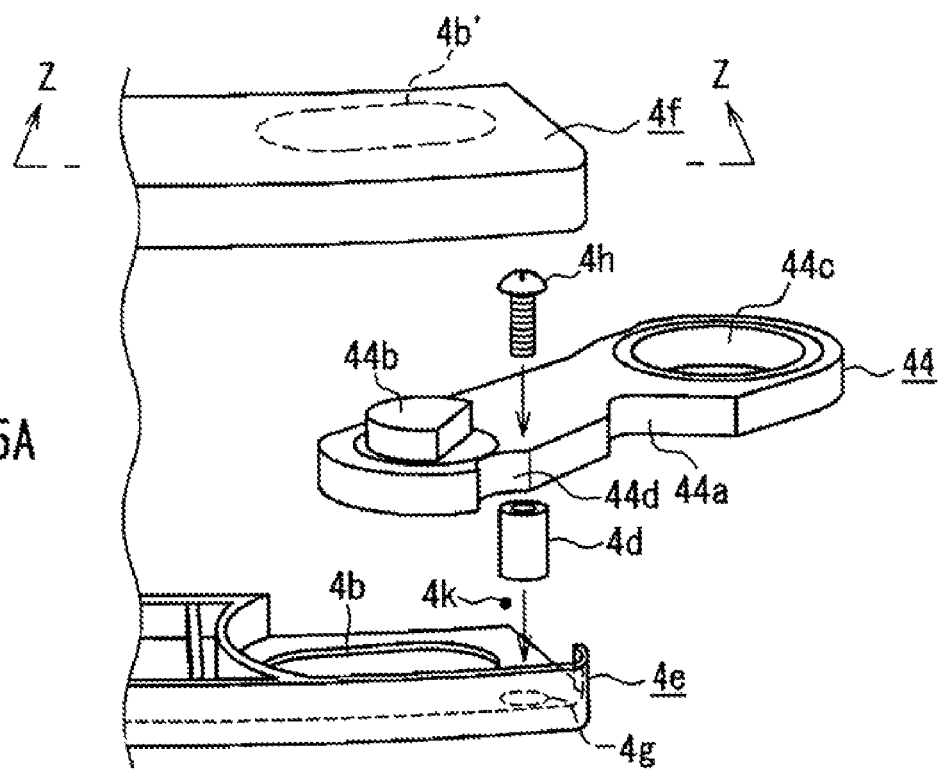
FIGS. 5A and 5B are exploded perspective views of a hand and arms.
Figure 5B:
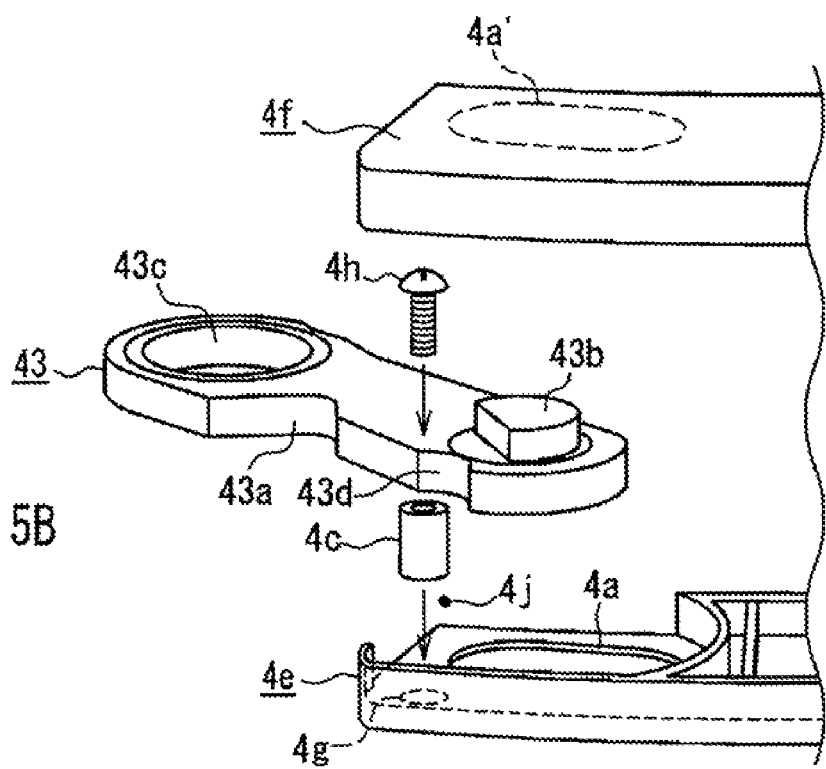
Figure 5C:
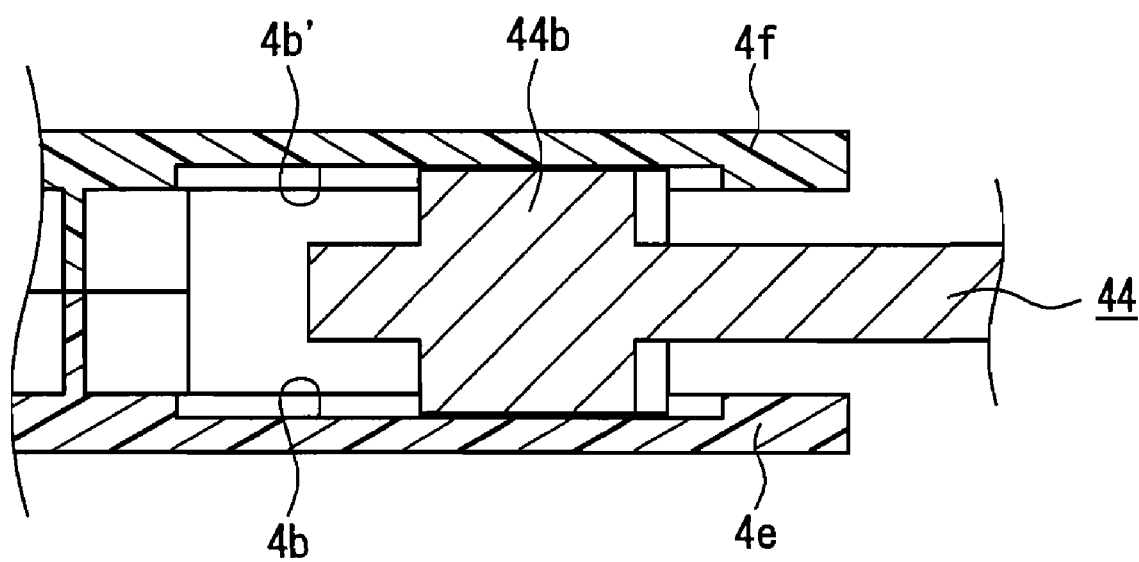
FIG. 5C is a cross-sectional view taken along the line Z-Z in FIG. 5A.

FIGS. 5A and 5B are exploded perspective views of the handle 4, the arm member 43, and the arm member 44. FIG. 5A illustrates the arm member 44 side and FIG. 5B illustrates the arm member 43 side. FIG. 5C is a cross-sectional view taken along the line Z-Z in FIG. 5A and shows the vicinity of the arm member 44. The cross-sectional view showing the vicinity of the arm member 43 is the same as FIG. 5C and therefore is omitted. As shown in FIGS. 5A and 5B, the handle 4 is composed of a pair of outer frame members 4e, 4f that can be joined together.

The outer frame member 4e has substantially oval recesses 4a, 4b that are formed in the inner surface at both ends of the outer frame member 4e in the longitudinal direction. The outer frame member 4f has substantially oval recesses 4a', 4b' that are formed in the inner surface at both ends of the outer frame member 4f in the longitudinal direction. The recesses 4a, 4a' face each other when the outer frame members 4e, 4f are joined together. The recesses 4b, 4b' face each other when the outer frame members 4e, 4f are joined together (see FIG. 5C). Shielding members 4c, 4d are provided in the vicinity of the recesses 4a, 4b of the outer frame member 4e, respectively. Openings 4k, 4j are provided at both ends of the outer frame member 4e in the longitudinal direction. The arm member 43 is put in the opening 4j. The arm member 44 is put in the opening 4k. The outer frame member 4f also has openings at the positions facing the openings 4j, 4k, respectively. However, those openings are omitted from the drawings.

The arm members 43, 44 are made of a metal such as magnesium. This can ensure the strength to resist bending or torsion. The arm members 43, 44 are preferably made of a metal, but can be made of a resin or the like if the strength is sufficient.

In the vicinity of one end of the arm member 43, substantially part-cylindrical protrusions 43b are formed on the upper and lower surfaces of the arm member 43, respectively. The protrusions 43b have an outer diameter such that they can be fitted movably into the recesses 4a, 4a'. In the vicinity of the other end of the arm member 43, a circular hole 43c is formed. The hole 43c has an inner diameter larger than the outer diameter of a cylindrical protrusion 41a (as will be described later) of the supporting member 41. The arm member 43 has a notch 43a (first notch) that is formed in the edge between the protrusion 43b and the hole 43c. The arm member 43 also has a notch 43d (second notch) that is formed in the edge near the protrusion 43b. The notch 43a is formed in the outer edge of the arm member 43 that lies on the opposite side to the first case 1.

In the vicinity of one end of the arm member 44, substantially part-cylindrical protrusions 44b are formed on the upper and lower surfaces of the arm member 44, respectively. The protrusions 44b have an outer diameter such that they can be fitted movably into the recesses 4b, 4b'. In the vicinity of the other end of the arm member 44, a circular hole 44c is formed. The hole 44c has an inner diameter larger than the outer diameter of a cylindrical protrusion 42a (as will be described later) of the supporting member 42. The arm member 44 has a notch 44a (first notch) that is formed in the edge between the protrusion 44b and the hole 44c. The arm member 44 also has a notch 44d (second notch) that is formed in the edge near the protrusion 44b. The notch 44a is formed in the outer edge of the arm member 44 that lies on the opposite side to the first case 1.

The shielding members 4c, 4d are made of plastic resins such as an acetal resin, an acrylonitrile-styrene resin, and an acrylonitrile-butadiene-styrene resin. In this embodiment, the shielding members 4c, 4d are made of an acetal resin so as to ensure high slidability. The shielding members 4c, 4d are substantially cylindrical in shape. A through hole into which a screw 4h can be inserted is formed in the substantial center of each of the shielding members 4c, 4d. The screws 4h are inserted into the through holes and threadably engaged with tapped holes 4g provided in the outer frame member 4e, so that the shielding members 4c, 4d can be fastened to the portions at both ends of the outer frame member 4e in the longitudinal direction, respectively.

In this embodiment, although the outer frame member 4e and the shielding members 4c, 4d are discrete members, a shielding portion having the same function as that of the shielding members 4c, 4d may be integrally formed with the outer frame member 4e. This configuration does not require the screws 4h, and thus can reduce the number of components. Moreover, this configuration eliminates the mounting process of the shielding members 4c, 4d using the screws 4h, and thus can reduce the man-hours during the manufacturing process.

In the above configuration, the outer frame members 4e, 4f are joined together so that the protrusions 43b are fitted movably into the recesses 4a, 4a' and the protrusions 44b are fitted movably into the recesses 4b, 4b'. Thus, the handle 4 and the arm members 43, 44 can be rotatably coupled to each other.

In this case, since the protrusions 43b can move in the recesses 4a, 4a', the arm member 43 can rotate about the protrusions 43b as an axis and slide while being guided by the recesses 4a, 4a' with respect to the handle 4. Similarly, since the protrusions 44b can move in the recesses 4b, 4b', the arm member 44 can rotate about the protrusions 44b as an axis and slide while being guided by the recesses 4b, 4b' with respect to the handle 4.

2-1. Movement of Handle 4

Figure 6A:
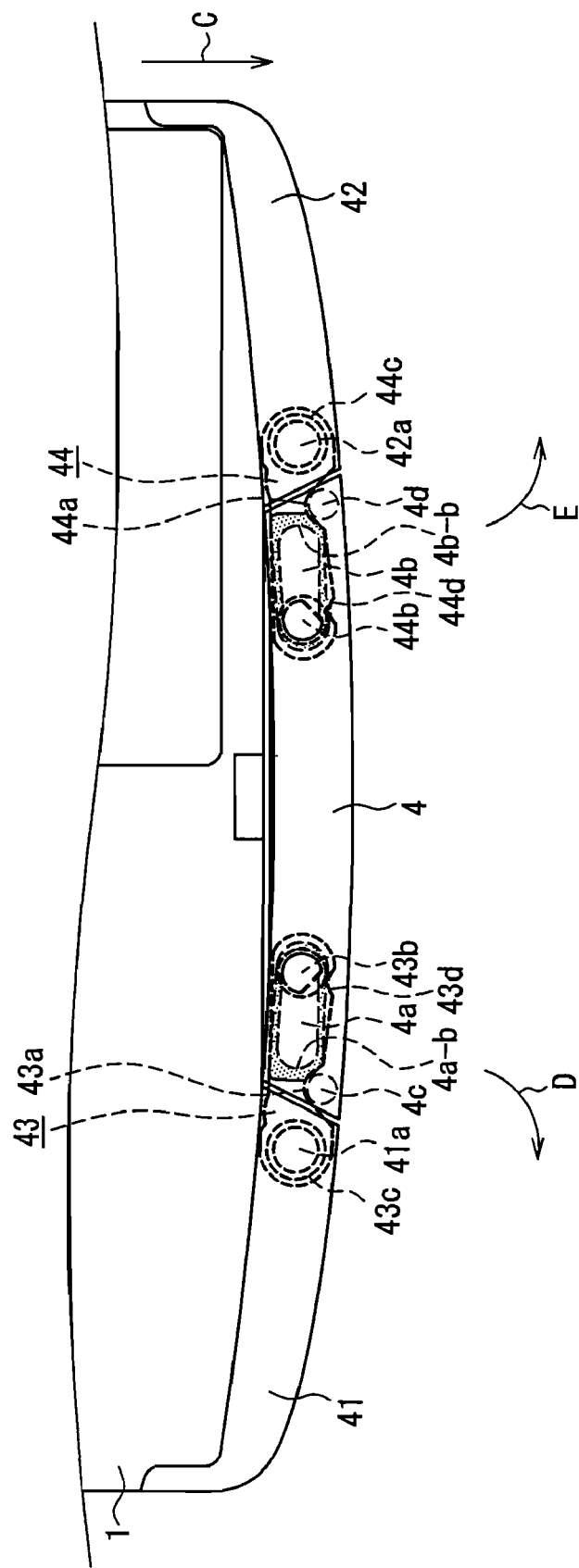
FIGS. 6A, 6B, and 6C are plan views showing the main parts for explaining the pulling and retracting operations of a handle.
Figure 6B:
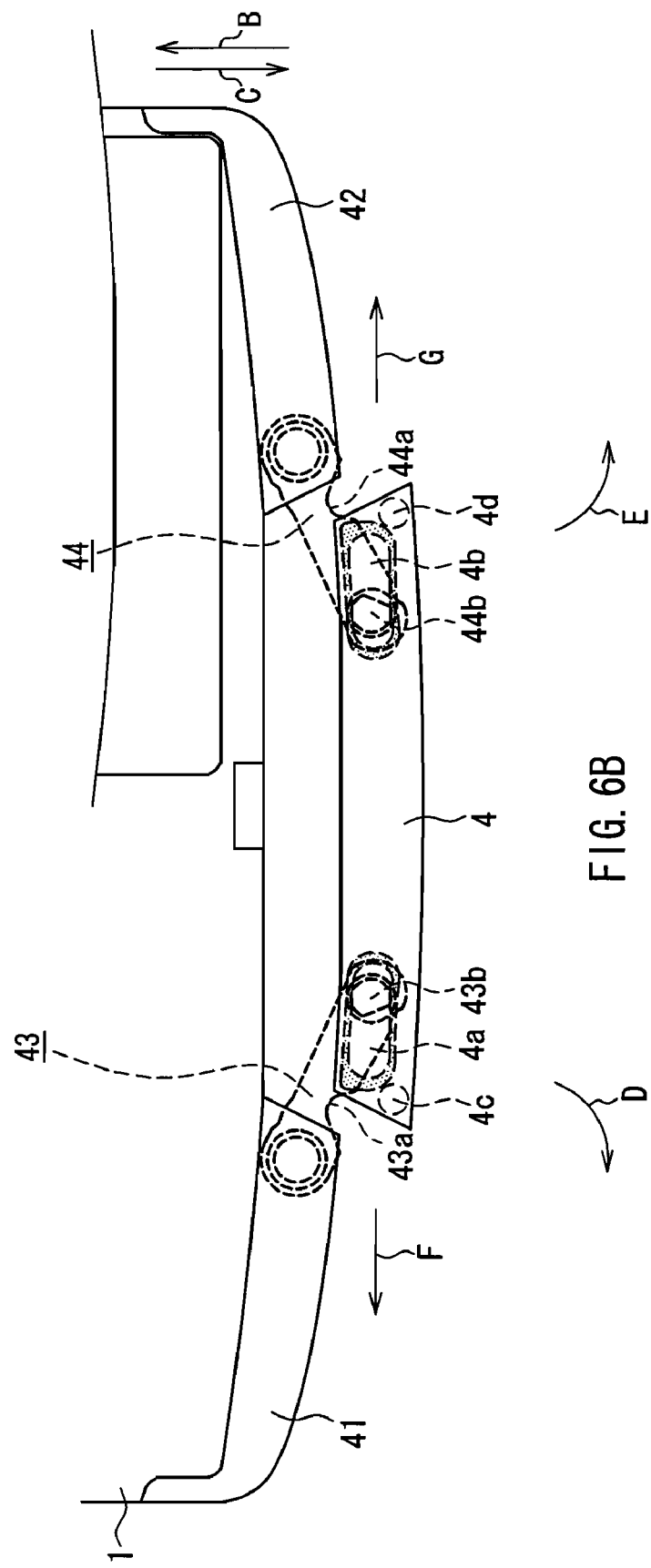
Figure 6C:
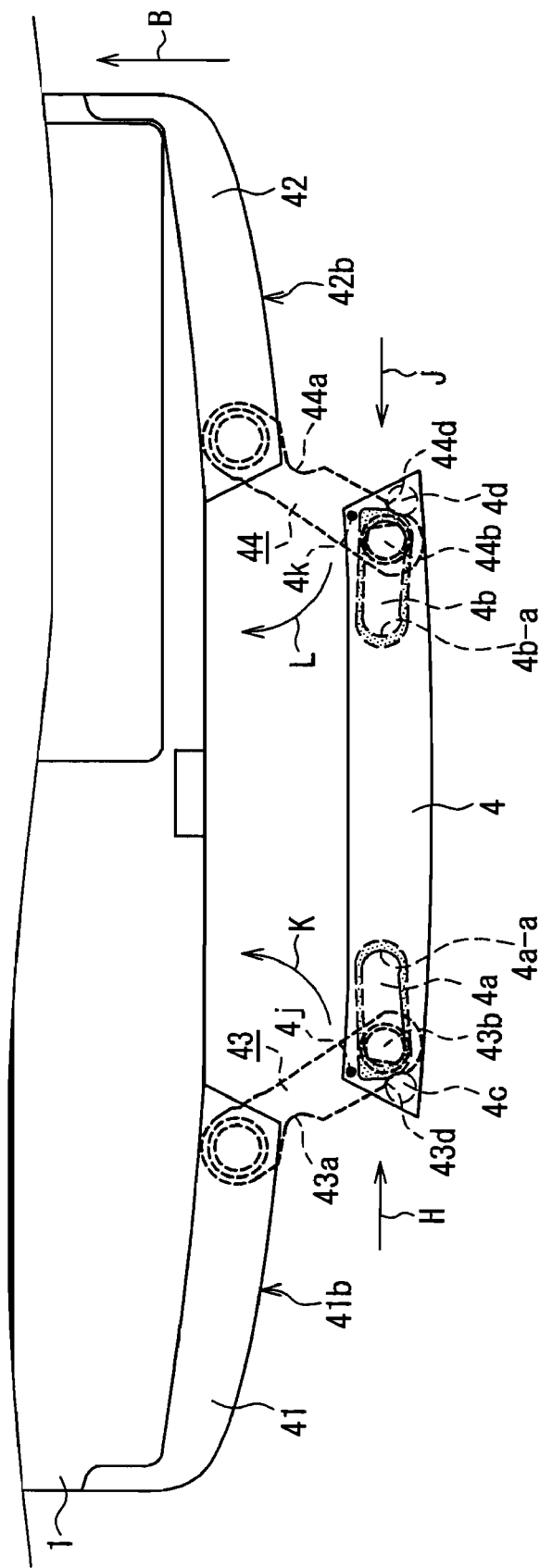
Figure 7:
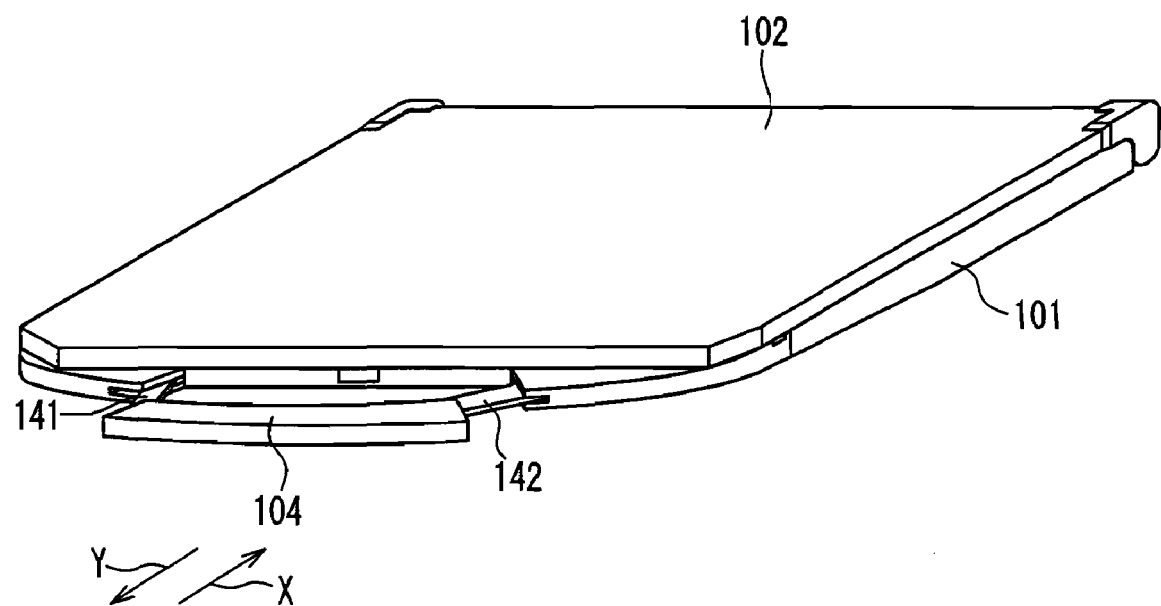
FIG. 7 is a perspective view showing a conventional notebook computer.
Figure 8:
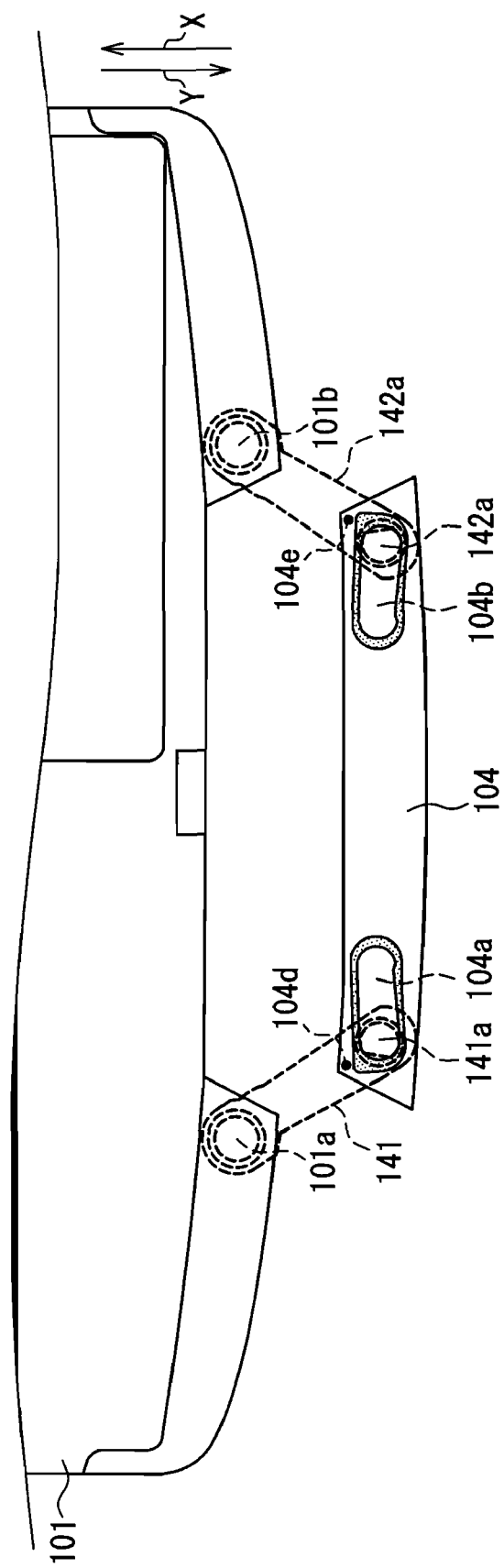
FIG. 8 is a plan view showing the vicinity of a handle of a conventional notebook computer.

FIG. 6A is a plan view showing the main parts in the vicinity of the grip device of the first case 1 when the handle 4 is at the retracted position. FIG. 6C is a plan view showing the main parts in the vicinity of the grip device of the first case 1 when the handle 4 is at the extended position. FIG. 6B shows a state between FIGS. 6A and 6C.

First, the pulling operation of the handle 4 will be described.

As shown in FIG. 6A, when the handle 4 is pulled from the retracted position in the direction of the arrow C, the arm member 43 rotates about the protrusion 41a of the supporting member 41 as an axis in the direction of the arrow D because the protrusion 43b is fitted movably into the recess 4a. Moreover, the arm member 44 rotates about a protrusion 42a of the supporting member 42 as an axis in the direction of the arrow E because the protrusion 44b is fitted movably into the recess 4b. At this time, as shown in FIG. 6B, the protrusion 43b is moved in the recess 4a in the direction of the arrow F, while the protrusion 44b is moved in the recess 4b in the direction of the arrow G.

When the handle 4 is pulled further from the position shown in FIG. 6B in the direction of the arrow C, it reaches the extended position, as shown in FIG. 6C. In the extended position of FIG. 6C, the protrusion 43b comes into contact with an edge 4a-b (see FIG. 6A) of the recess 4a, and thus the position of the handle 4 relative to the arm member 43 is determined. Moreover, the protrusion 44b comes into contact with an edge 4b-b (see FIG. 6A) of the recess 4b, and thus the position of the handle 4 relative to the arm member 44 is determined. Accordingly, the movement of the handle 4 in the direction of the arrow C can be controlled.

Next, the retracting operation of the handle 4 will be described.

As shown in FIG. 6C, when the handle 4 is moved from the extended position in the direction of the arrow B, the arm member 43 rotates about the protrusion 41a of the supporting member 41 as an axis in the direction of the arrow K because the protrusion 43b is fitted movably into the recess 4a. Moreover, the arm member 44 rotates about the protrusion 42a of the supporting member 42 as an axis in the direction of the arrow L because the protrusion 44b is fitted movably into the recess 4b. At this time, as shown in FIG. 6B, the protrusion 43b is moved in the recess 4a in the direction of the arrow G, while the protrusion 44b is moved in the recess 4b in the direction of the arrow F.

When the handle 4 is moved further from the position shown in FIG. 6B in the direction of the arrow B, it reaches the retracted position, as shown in FIG. 6A. In the retracted position of FIG. 6A, the protrusion 43b comes into contact with an edge 4a-a (see FIG. 6C) of the recess 4a, and the protrusion 44b comes into contact with an edge 4b-a (see FIG. 6C) of the recess 4b.

The inner surface of the notch 43a on the supporting member 41 side is substantially flush with a side 41b (i.e., a surface substantially parallel to the side 1b of the first case 1) of the supporting member 41. In this case, the inner surface of the notch 43a and the side 41b of the supporting member 41 do not necessarily form a completely continuous surface, but may form a slightly uneven surface. Therefore, when the handle 4 is moved from the extended position (FIG. 6C) in the direction of the arrow B and thus allows the arm member 43 to rotate in the direction of the arrow K, a foreign matter cannot be caught easily between the supporting member 41 and the arm member 43. Similarly, the inner surface of the notch 44a on the supporting member 42 side is substantially flush with a side 42b (i.e., a surface substantially parallel to the side 1b of the first case 1) of the supporting member 42. In this case, the inner surface of the notch 44a and the side 42b of the supporting member 42 do not necessarily form a completely continuous surface, but may form a slightly uneven surface. Therefore, when the handle 4 is moved from the extended position (FIG. 6) in the direction of the arrow B and thus allows the arm member 44 to rotate in the direction of the arrow L, a foreign manner cannot be caught easily between the supporting member 42 and the arm member 44.

2-2. Roles of Shielding Members 4c and 4d

The roles of the shielding members 4c, 4d during the pulling and retracting operations of the handle 4 will be described.

First, as shown in FIG. 6A, when the handle 4 is at the retracted position, the shielding member 4c is in contact with the notch 43a and the shielding member 4d is in contact with the notch 44a. This can position the handle 4 at the retracted position.

When the handle 4 is pulled from the retracted position (FIG. 6A) in the direction of the arrow C, the shielding member 4c is separated from the notch 43a due to the rotation of the arm member 43 in the direction of the arrow D, and the shielding member 4d is separated from the notch 44a due to the rotation of the arm member 44 in the direction of the arrow E, as shown in FIGS. 6B and 6C. In the retracted position of FIG. 6A, the shielding members 4c, 4d are placed inside the notches 43a, 44a, respectively. Therefore, it is possible to provide tactile feedback when the shielding members 4c, 4d are separated from the notches 43a, 44a.

In the state shown in FIG. 6C, the shielding member 4c is placed in the opening 4j (see FIG. 5B) formed between the handle 4 and the arm member 43, and the shielding member 4d is placed in the opening 4k (see FIG. 5A) formed between the handle 4 and the arm member 44. The presence of the shielding members 43a, 44a can make the openings 4j, 4k narrower and reduce the intrusion of a foreign matter into the handle 4 from the direction of the arrow H or J.

When the handle 4 is pulled from the position shown in FIG. 6A or 6B to the extended position shown in FIG. 6C, the shielding member 4c is brought into contact with the notch 43d and the shielding member 4d is brought into contact with the notch 44d, so that tactile feedback can be provided. By bringing the shielding members 4c, 4d into contact with the notches 43d, 44d, respectively, it is possible to position the handle 4 and the arm members 43, 44 at the extended position.

Since the shielding member 4c is placed in the opening 4j and the shielding member 4d is placed in the opening 4k, when the handle 4 is retracted from the state shown in FIG. 6C in the direction of the arrow B, a foreign matter is hardly caught in the openings 4j, 4k. Therefore, the handle 4 can be moved smoothly to the retracted position shown in FIG. 6A.

Moreover, when the handle 4 is moved from the position shown in FIG. 6C or 6B to the retracted position shown in FIG. 6A, the shielding member 4c is brought into contact with the notch 43a and the shielding member 4d is brought into contact with the notch 44a, so that tactile feedback can be provided.

As shown in FIG. 6A, by bringing the shielding members 4c, 4d into contact with the notches 43a, 44a, respectively, it is possible to position the handle 4 and the arm members 43, 44 at the retracted position.

3. Effect of the Embodiment and Others

In the above embodiment, the shielding members 4c, 4d are placed in the openings 4j, 4k of the handle 4 in which the arm members 43, 44 are to be arranged, respectively. This can make it difficult for a foreign matter to enter the handle 4 via the openings 4j, 4k.

Due to the presence of the shielding members 4c, 4d, when the handle 4 is moved from the extended position to the retracted position, a foreign matter cannot be caught easily in the openings 4j, 4k between the handle 4 and the arm members 43, 44, respectively. Therefore, the handle 4 can be moved smoothly.

Since the shielding members 4c, 4d are made of a plastic resin, it is possible to reduce unusual sounds produced when the shielding member 4c is brought into contact with the arm member 43 or when the shielding member 4d is brought into contact with the arm member 44 during the retracting or pulling operation of the handle 4.

Moreover, the shielding members 4c, 4d made of a plastic resin can prevent the arm members 43, 44 from being scratched easily. In addition, if a coating is applied to the arm members 43, 44, the shielding members 4c, 4d also can prevent the coating from coming off easily. Because of the repetition of the retracing and pulling operations of the handle 4, the arm members 43, 44 repeatedly come into contact with the shielding members 4c, 4d. In this embodiment, however, since the shielding members 4c, 4d are made of a plastic resin, even if the arm members 43, 44 repeatedly come into contact with the shielding members 4c, 4d, the arm members 43, 44 are not likely to be scratched, or the coating of the arm members 43, 44 is not likely to come off.

In this embodiment, the substantially oval recesses 4a, 4b (4a', 4b') are formed in the handle 4. However, the grip device can be operated in the same manner as this embodiment even if substantially oval recesses are formed in the vicinity of the end of the arm member 43 on the supporting member 41 side and in the vicinity of the end of the arm member 44 on the supporting member 42 side.

In this embodiment, the supporting members 41, 42 are separately formed from the first case 1, but may be integrally formed with the first case 1.

The handle 4 in this embodiment is an example of the grip of the present invention. The supporting member 41 in this embodiment is an example of the first stationary portion of the present invention. The supporting member 42 in this embodiment is an example of the second stationary portion of the present invention. The shielding members 4c, 4d in this embodiment are examples of the shielding portions of the present invention. The notches 43a, 44a in this embodiment are examples of the first notches of the present invention. The notches 43d, 44d in this embodiment are examples of the second notches of the present invention. The arm member 43 in this embodiment is an example of the first arm member of the present invention. The arm member 44 is an example of the second arm member of the present invention.

The grip device of the present invention is useful for equipment having a handle that is retractable in a case. The information processing unit of the present invention is useful, e.g., for a notebook computer with a built-in grip device.

The following notes are disclosed with respect to this embodiment.

(Note 1)

A grip device comprising:

a pair of first and second stationary portions that are fixed to a case;

a pair of first and second arm members, each of which has two ends, and one end of the first arm member and one end of the second arm member are supported rotatably by the first stationary portion and the second stationary portion, respectively; and a grip that is supported rotatably between the other end of the first arm member and the other end of the second arm member, that has openings at both ends for receiving the first arm member and the second arm member, and that can accommodate the first arm member and the second arm member through the openings, wherein the grip includes shielding portions for shielding the openings.

(Note 2)

The grip device according to note 1, wherein the grip is supported by the first stationary portion and the second stationary portion so as to be movable between a retracted position that is close to the case and an extended position that is away from the case, and wherein the first arm member and the second arm member have first notches that are in contact with the shielding portions when the grip is at the retracted position, respectively.

(Note 3)

The grip device according to note 2, wherein the first notches are provided in outer edges of the first arm member and the second arm member on an opposite side to the case, and an inner surface of each of the first notches on a stationary portion side is substantially flush with a side of the stationary portion when the grip is at the extended position.

(Note 4)

The grip device according to note 2, wherein the first arm member and the second arm member further have second notches that are in contact with the shielding portions when the grip is at the extended position, respectively.

(Note 5)

The grip device according to note 1, wherein the shielding portions are made of a plastic resin.

(Note 6)

An information processing unit comprising:

an information signal input portion for inputting an information signal;

a case containing an information processing means for processing the information signal; and a grip device coupled to the case, wherein the grip device comprises:

a pair of first and second stationary portions that are fixed to the case;

a pair of first and second arm members, each of which has two end, and one end of the first arm member and one end of the second arm member are supported rotatably by the first stationary portion and the second stationary portion, respectively; and a grip that is supported rotatably between the other end of the first arm member and the other end of the second arm member, that has openings at both ends for receiving the first arm member and the second arm member, and that can accommodate the first arm member and the second arm member through the openings, wherein the grip includes shielding portions for shielding the openings.

(Note 7)

The information processing unit according to note 6, wherein the grip is supported by the first stationary portion and the second stationary portion so as to be movable between a retracted position that is close to the case and an extended position that is away from the case, and wherein the first arm member and the second arm member have first notches that are in contact with the shielding portions when the grip is at the retracted position, respectively.

(Note 8)

The information processing unit according to note 7, wherein the first notches are provided in outer edges of the first arm member and the second arm member on an opposite side to the case, and an inner surface of each of the first notches on a stationary portion side is substantially flush with a side of the stationary portion when the grip is at the extended position.

(Note 9)

The information processing unit according to note 7, wherein the first arm member and the second arm member further have second notches that are in contact with the shielding portions when the grip is at the extended position, respectively.

(Note 10)

The information processing unit according to note 6, wherein the shielding portions are made of a plastic resin.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A grip device comprising:
a pair of first and second stationary portions that are fixed to a case;
a pair of first and second arm members, each of which has two ends, and one end of the first arm member and one end of the second arm member are supported rotatably by the first stationary portion and the second stationary portion, respectively; and
a grip that is supported rotatably between the other end of the first arm member and the other end of the second arm member, that has openings at both ends for receiving the first arm member and the second arm member, and that can accommodate the first arm member and the second arm member through the openings,
wherein the grip includes shielding portions for shielding the openings.

2. The grip device according to claim 1, wherein the grip is supported by the first stationary portion and the second stationary portion so as to be movable between a retracted position that is close to the case and an extended position that is away from the case, and
wherein the first arm member and the second arm member have first notches that are in contact with the shielding portions when the grip is at the retracted position, respectively.

3. The grip device according to claim 2, wherein the first notches are provided in outer edges of the first arm member and the second arm member on an opposite side to the case, and
an inner surface of each of the first notches on a stationary portion side is substantially flush with a side of the stationary portion when the grip is at the extended position.

4. The grip device according to claim 2, wherein the first arm member and the second arm member further have second notches that are in contact with the shielding portions when the grip is at the extended position, respectively.

5. The grip device according to claim 1, wherein the shielding portions are made of a plastic resin.

6. An information processing unit comprising:
an information signal input portion for inputting an information signal;
a case containing an information processing means for processing the information signal; and
a grip device coupled to the case,
wherein the grip device comprises:
a pair of first and second stationary portions that are fixed to the case;
a pair of first and second arm members, each of which has two end, and one end of the first arm member and one end of the second arm member are supported rotatably by the first stationary portion and the second stationary portion, respectively; and
a grip that is supported rotatably between the other end of the first arm member and the other end of the second arm member, that has openings at both ends for receiving the first arm member and the second arm member, and that can accommodate the first arm member and the second arm member through the openings,
wherein the grip includes shielding portions for shielding the openings.

7. The information processing unit according to claim 6, wherein the grip is supported by the first stationary portion and the second stationary portion so as to be movable between a retracted position that is close to the case and an extended position that is away from the case, and
wherein the first arm member and the second arm member have first notches that are in contact with the shielding portions when the grip is at the retracted position, respectively.

8. The information processing unit according to claim 7, wherein the first notches are provided in outer edges of the first arm member and the second arm member on an opposite side to the case, and
an inner surface of each of the first notches on a stationary portion side is substantially flush with a side of the stationary portion when the grip is at the extended position.

9. The information processing unit according to claim 7, wherein the first arm member and the second arm member further have second notches that are in contact with the shielding portions when the grip is at the extended position, respectively.

10. The information processing unit according to claim 6, wherein the shielding portions are made of a plastic resin.

* * * * *

UNITED STATES PATENT AND TRADEMARK OFFICE
CERTIFICATE OF CORRECTION

| | | |
|---|---|---|
| PATENT NO. | : 7,936,562 B2 | Page 1 of 1 |
| APPLICATION NO. | : 12/551829 | |
| DATED | : May 3, 2011 | |
| INVENTOR(S) | : Nagamura et al. | |

It is certified that error appears in the above-identified patent and that said Letters Patent is hereby corrected as shown below:

Column 12, line 20 (claim 6): "two end" should read -- two ends --.

Signed and Sealed this
Eighth Day of November, 2011

David J. Kappos
*Director of the United States Patent and Trademark Office*